United States Patent [19]
McSparran et al.

[11] Patent Number: 4,996,487
[45] Date of Patent: Feb. 26, 1991

[54] APPARATUS FOR DETECTING FAILURE OF THERMAL HEATERS IN INK JET PRINTERS

[75] Inventors: Ray A. McSparran, Charlotte; William S. Moore, Mooresville; James R. Wooden, Charlotte, all of N.C.

[73] Assignee: International Business Machines Corporation, Armonk, N.Y.

[21] Appl. No.: 342,058

[22] Filed: Apr. 24, 1989

[51] Int. Cl.[5] .......... G01R 31/02
[52] U.S. Cl. .......... 324/549; 219/216 PH; 219/506; 324/523; 324/525; 324/718; 346/76 PH; 346/140 R
[58] Field of Search .......... 324/549, 502, 512, 537, 324/522, 523, 525, 64, 718, 713; 346/140 R, 1.1, 76 PH; 219/497, 506, 216 PH

[56] References Cited

U.S. PATENT DOCUMENTS

| | | | |
|---|---|---|---|
| 3,467,864 | 9/1969 | Vander | 324/502 X |
| 4,345,262 | 8/1982 | Shirato et al. | 346/140 R |
| 4,471,298 | 9/1984 | Lee et al. | 346/140 |
| 4,484,199 | 11/1984 | Watanabe | 346/1.1 |
| 4,500,893 | 2/1985 | Sakura et al. | 346/76 PH |
| 4,550,327 | 10/1985 | Miyakawa | 346/140 |
| 4,769,657 | 9/1988 | Takahashi | 219/506 X |
| 4,774,526 | 9/1988 | Ito | 346/76 PH |

OTHER PUBLICATIONS

"Integrating the Printhead into the HB Deskjet Printer", Hewlett-Packard Journal, (Oct., 1988) pp. 62–64 by J. P. Harmon and J. A. Widder.

*Primary Examiner*—Reinhard J. Eisenzopf
*Assistant Examiner*—Robert W. Mueller
*Attorney, Agent, or Firm*—Calfee, Halter & Griswold

[57] ABSTRACT

According to the present invention, a method and device for detecting failure of heating elements in various jets of a thermal jet printing device is provided. The printing device which includes a plurality of thermally actuated printing jets, each of which jets includes a resistance heating element, is actuated when a current is supplied to generate a bubble. The bubble expands eject a drop of ink. Electrical circuit means are provided including power supply means to supply current to the electrical resistance elements. Control means are also provided to selectively connect the elecrical resistance elements to this power supply in preselected arrays for forming bubbles in selected configuration to perform the ink jet printing. The operation includes a test circuit coupled to the resistive heater elements and operable by the control circuit to generate a failure signal representative of a resistance above a preselected value in any resistance heating elements. With means to detect the failure signal to identify the resistance heating element which has failed.

15 Claims, 2 Drawing Sheets

APPARATUS FOR DETECTING FAILURE OF THERMAL HEATERS IN INK JET PRINTERS

BACKGROUND OF THE INVENTION

1. Field of the Invention

This invention relates to ink jet printing systems, and more particularly to a device and method for detecting the failure of thermal heaters in bubble type ink jet printing systems.

2. Description of the Prior Art

Thermal drop on demand ink jet printing systems are well known in which a heater is selectively energized to form a "bubble" in an associated ink well. The rapid growth of the bubble causes an ink drop to be ejected from a nozzle associated therewith. Printing is accomplished by energizing the heater each time a drop is required at the nozzle position for a sufficient period of time to generate a gas bubble, cause the bubble's growth and cause an ink drop to be ejected from the nozzle by the action of the gas bubble. Conventionally, there are a whole array of jet nozzles closely spaced with respect to each other and the character or other form to be printed is determined by what pattern of nozzles is actuated to provide the desired configuration of printing on the printing surface.

The control of the pattern or actuation of the jets to be actuated is done by any one of a number of well known control devices which normally include microprocessors and other circuitry necessary to selectively actuate the desired pattern of heaters In this type of printing, each particular drop of ink emitted contributes to the overall configuration of the desired character which is being printed If for any reason an ink drop should not be ejected from a particular nozzle when desired, that particular portion of the character will be missing. In very high resolution printing, the absence of one or two drops may not be critical although their absence can be recognized by a trained eye. In lower resolution printing (i.e. less drops per character) the absence of a single drop becomes more critical. In any event, to insure proper functioning of an apparatus in its designed mode, it is necessary to keep most, if not all, of the individual jets operating as required to form the required character One particular configuration of a heating element for bubble type printers includes a resistance heating element applied to a substrate with a passivation layer overlying the heating element The current is selectively applied to the elements of the various nozzles to cause the ink drop ejection. One of the causes of permanent failure of an ink jet nozzle is failure of the heater to heat the ink as desired. While there are several causes of failure of any particular heating element, far and away the largest cause is the degradation of the passivation layer thus exposing the underlying heater to the ink and the surrounding conditions which can then quickly result in a failure of the heater element. Typically the heater element just "burns out"; i.e. the heating element either fractures or breaks and goes to essentially an infinite resistance thereby preventing the passage of current. It is desirable to be able to detect the failures of individual jet nozzles as they occur; and further it is desirable to be able to determine the mode of failure. Did the nozzle fail to eject a drop of ink because the heater failed to produce the necessary bubble action? Or was there some other reason?—e.g. clogged nozzles, etc. Once the failure mode has been determined necessary corrective action can be taken such as replacing the printhead in the event that a number of heater failures have occurred such that the head is deemed to provide unacceptable output (which may be only one defective heater element, or may be more than one depending on the head configuration, and the environment in which it is used) If it is not a failure of the heating element then other corrective actions such as cleaning the head may be taken. One of the advantages of including a means of detecting heater failure within an ink jet printer is that a repairable failure of the head such as a clogged nozzle can be distinguished from an irreparable failure of the printhead.

There have been several prior art proposals for detecting failure in bubble type ink jet devices which include U S. Pat. Nos. 4,550,327; 4,484,199; 4,471,298; 4,774,526; and 4,769,657. However none of these references teach or suggest a test circuit which can be interposed within the operating system of a printer for periodically checking the condition of the heaters of each of the jet nozzles individually while utilizing the system device power supply. The Hewlett-Packard printer utilizes a linear circuit to perform test functions on heaters, which is described in Hewlett-Packard Journal of October, 1988. This is not a non-linear connection and operates differently from the present device

SUMMARY OF THE INVENTION

According to the present invention, a method and device for detecting failure of the heating elements in the various jets of a thermal jet printing device is provided. The printing device includes a plurality of thermally actuated printing jets each of which jets includes an electrical resistance element which when heated will generate a bubble. Electrical circuit means are provided, including power supply means, to supply current to the electrical resistance elements, and control means are provided to selectively connect the elements to the power supply in preselected arrays for forming bubbles in a selected configuration. The apparatus includes a test circuit connected to the power supply and to the control means to sequentially connect each of the resistance elements individually to the power supply through the test circuit The test circuit includes means to generate a failure signal representative of a resistance above a preselected value in any resistance element, and means to detect said failure signal and indicate which resistance element had failed, whereby the condition of each heating element can be periodically ascertained and indicated.

DESCRIPTION OF THE PREFERRED EMBODIMENTS

Figure 1:
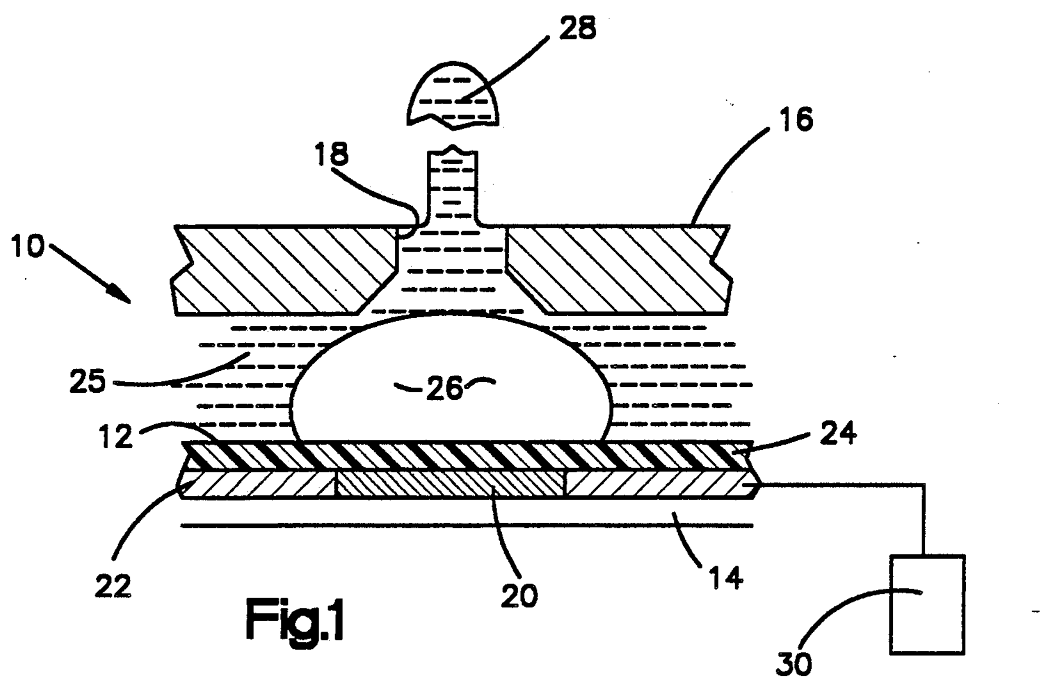
FIG. 1 is a longitudinal sectional view, very schematic, showing the principle of operation of a generated bubble in an ink jet printing element.

Referring now to the drawing, and for the present, to FIG. 1, a very schematic representation of the structure and operation of a fully actuated bubble generated ink jet drop being expelled from a nozzle is shown in a sectional view. Only one of an array of ink jet nozzles is shown and designated generally by the reference character 10. The nozzle has a chamber 12 which is defined by a substrate 14 and a nozzle plate 16. The nozzle plate 16 has an aperture or opening 18 through which the ink jet drops are expelled. The substrate 14 has formed thereon at each ink jet location an electrical resistance heating element 20, which is supplied by power from electrode 22, which is in circuit relationship therewith. A passivation or overcoat layer 24 is provided over the heater and electrode and protects the electrode and heater from exposure to the ambient surroundings. If this overcoat or passivation layer 24 deteriorates or is in some way broken down, the heater 20 rapidly deteriorates to the point where it is non-functioning.

In its functioning state, a liquid ink 25 is provided in the chamber 12, and current is supplied from the electrode 22 to the heater 20 which causes a gas bubble 26 to be formed above the heater The bubble 26 causes a drop of ink 28 to be expelled from the aperture 18 of the nozzle plate 16. In the formation of the bubble 26, the heater 20 is supplied with the current for a predetermined period of time which is normally in excess of about 5 microseconds. If the heat is applied to the heater 20 for a period of time less than about 3 microseconds, no significant bubble will be formed, hence, no actuation of the nozzle will occur. This becomes significant in conjunction with the test apparatus which will be described presently and which is the subject matter of the present invention.

The present invention is configured to test whether the heaters 20 of each of the ink jet nozzles 10 are operating; i.e. if current is passing through them and causing the heaters to perform their function, or whether they are burned out and not operating, i.e. there is a break in the heater so that the resistance is high enough to prevent it from working.

The electrode 22 is shown schematically connected to a power supply 30 which in a conventional manner provides power to the heater which will be supplied in the desired pattern of heaters for the array of ink jet units which makes up a printing head in a manner which will be described presently to print the desired ink jet character. This ink jet unit with its power supply and some type of control device for operating the ink jets for printing is well known in the art and does not per se constitute the present invention.

Figure 2:
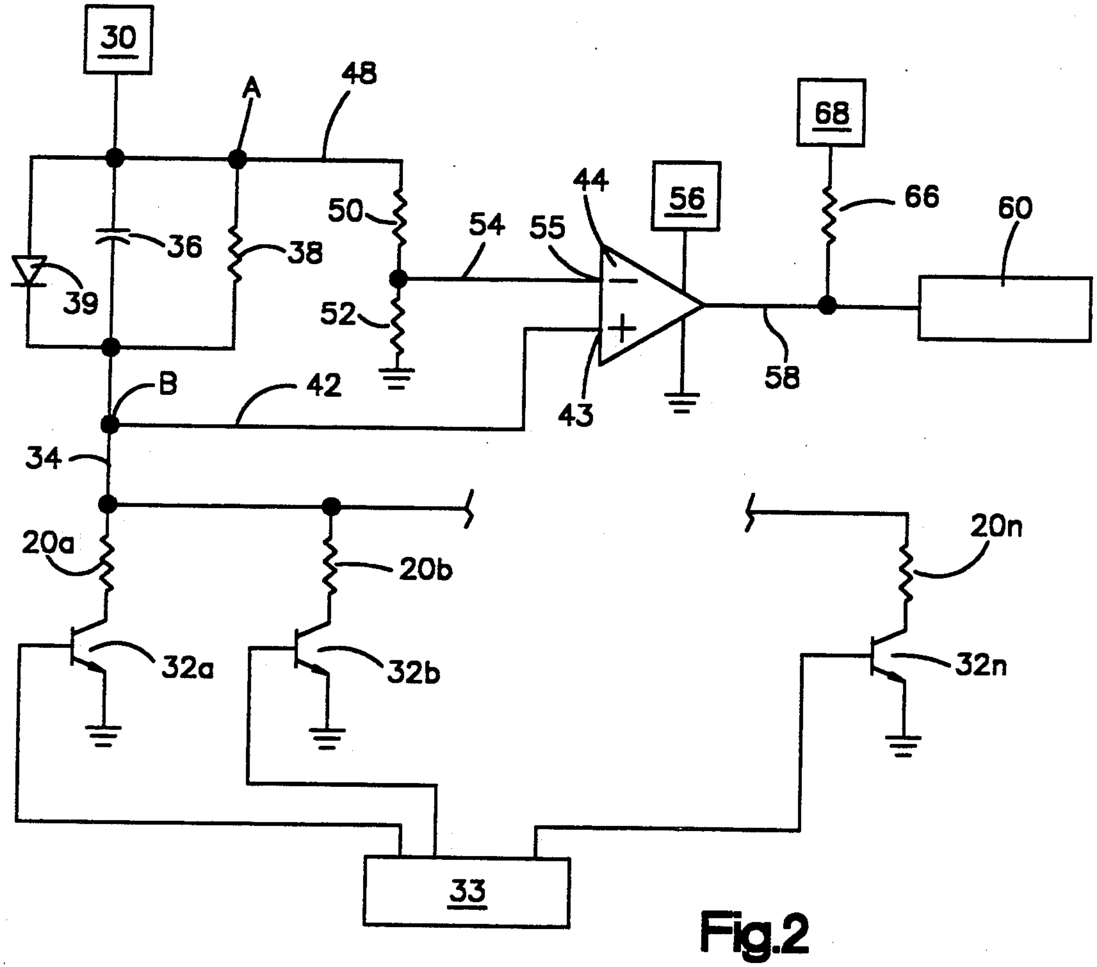
FIG. 2 is a circuit diagram showing one embodiment of a test circuit according to this invention for determining whether an element in a given nozzle is functioning.

Referring now to FIG. 2, one embodiment of circuit for operating and for periodically testing the operativeness of each of the heaters 20 is shown. As shown in FIG. 2, the printing head of the jet device includes a plurality of heaters 20*a* through 20*n* which as described above are each associated with one particular nozzle. Each of the heaters 20 (which conventionally have a resistance of about 50 ohms), are connected through transistors 32*a* through 32*n* to ground. The transistors in turn are connected to a control device 33 which is conventional and normally will include a microprocessor and associated circuitry to turn on the transistors 32*a* through 32*n* either individually or in any selected pattern to allow current to flow from power supply 30 to selected heaters 20*a* through 20*n* for a period of time (e.g. 5 microseconds or more) from the power supply 30 through circuitry to cause ink jet drops to be expelled from the nozzles.

The circuitry includes a conductor 34 connected through a capacitor 36 and resistor 38 and diode 39 to the power source 30 which is typically in the range of 15 to 30 volts. depending upon the various parameters of the printhead. This portion of the circuit is used to supply the current to the heaters 20*a* through 20*n* in selected patterns to operate the heaters 20 and to also provide the current for testing, as will be described presently.

The combination of the diode 39, the capacitor 36, and the resistor 38 perform a number of functions. The resistor 38 provides a source for the leakage currents required by the drive transistors. The diode 39 provides a low impedance path for the current required by the heater elements in normal operation of the printhead such that the voltage supplied to the actual heater elements is not significantly lower than that of the supply voltage. The capacitor 36 is used to store an electrical charge, thus preventing a temporary voltage drop when the drive transistors are first turned on to initiate printing. This is required because of the diode recovery time.

The following circuitry provides the test functions in the form of signal generating and detecting means nonlinearly coupled to the resistance heating elements 20. Conductor 34 is connected through conductor 42 to one input terminal 43 of voltage comparator 44, and which in the preferred embodiment is an LM339. (This is a conventional designation and is applied to devices sold by several different companies, including National Semiconductor). Preferably the resistor 38 is about five ohms and the capacitor 36 has a capacitance of about one microfarad. The power supply 30 is also connected through line 48 and through resistors 50 and 52 to ground. Typically, resistor 50 has a value of about 100 ohms and resistor 52 a value of about 5.1K ohms. A conductor 54 is center tapped between resistors 50 and 52 and connected to the other input terminal 55 of the voltage comparator 44. The voltage comparator is driven by a second power source 56 which is conventionally of a somewhat higher voltage than power supply 30. The comparator 44 is connected through a conductor 58 on its output side to a detector 60 which will detect whether the voltage applied at the input terminal 43 exceeds or is less than the voltage applied at the terminal 55 in a conventional manner. The conductor 58 is also connected through resistor 66 to a 5 volt source 68. The resistor 66 typically will have a value of about 1,000 ohms.

During normal operation of the ink jet device, the power source 30 is connected to the desired grouping of heaters 20*a*–20*n* to provide the desired pattern of droplets by means of the control device 33. The transistors 32*a* through 32*n* will be turned on and off as required to provide this necessary pattern and be left on a sufficiently long time so as to provide for bubble formation and expelling of the drops as described above. Typically, there can be 12 or more different nozzles in a printhead to be selectively activated to form a character in lower resolution printing and as many as 50 or more nozzles for very high resolution printing just for the production of a single character.

The circuitry described in FIG. 2 also is adapted to test each heater 20 individually to see if it is functioning. This test works in the following manner: With all of the transistors 32*a* through 32*n* turned off, the transistors 32 are in a high resistance condition and only a very small leakage current will be flowing from the power source 30 through any of the heaters 20 and thus the voltage level at point A will be essentially the same as that at point B. Since point B is connected directly to the voltage comparitor 44, and point A is connected through resistor 50 and further since point A has current flowing through resistor 50 and 52, the voltage at terminal 55 will be less than that at terminal 43. The test cycle comprises having the control 33 sequentially connect each of the heaters 20*a* through 20*n* through transistors 32*a* through 32*n* to ground. If the heater 20 being tested has failed and has an open or for any other reason a resistance above a given value, e.g. about 170 ohms, there will be little or no current flowing through conductor 34 and hence terminal 55 will remain at a lower voltage than terminal 43. Hence, the voltage comparitor 44 will not change state and there will be no change in the output level. Thus, as each heater is tested if there is no level change in the output that means that the heater has failed since a lack of a change in the output level from the comparator 44 means a failed heater. If, on the other hand, when the respective transistor 32 is turned on and the heater is functioning and has its normal resistance, e. g. about 50 ohms, current will flow through conductor 34 and will pull point B down to a voltage level less than the voltage level at terminal 55 and hence the comparator 44 will switch state. Upon switching state, the comparitor 44 will provide an output signal which the detector 60 will detect, the output signal indicating a valid or working heater.

Of course, during the testing cycle, current should be applied in a sufficiently short time, e.g. less than about 3 microseconds, so as not to generate a bubble and cause any unwanted ink drops. Alternatively, if a longer test period is deemed desirable or necessary, the head could be moved to a special location away from the print medium for test purposes.

Of course, if desired, some combinations of resistance elements, rather than an individual resistance element can be connected for testing as a group with the signal indicating one or more failures of the resistance elements in the group.

Figure 3:
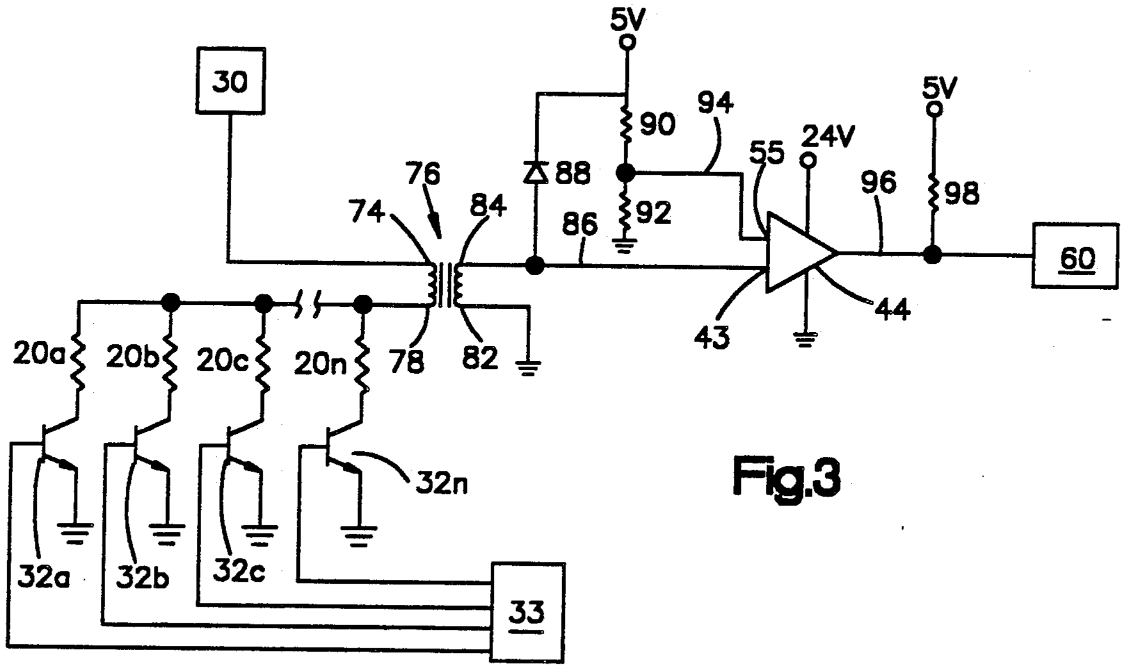
FIG. 3 is a circuit diagram of another embodiment of a circuit for determining whether a heating element is operating in a given nozzle.

Referring now to FIG. 3, another embodiment of the present invention is shown. In this embodiment, the voltage source 30, which in a typical case is in the range of 15 to 30 volts, is connected to one end 74 of the primary winding of a toroidal core transformer 76 the other end 78 of the primary winding being connected in series to the resistors 20*a* through 20*n*. As in the previous embodiment, transistors 32*a* through 32*n* are connected to their respective heaters 20*a* through 20*n* and operatively connected to control 33. One side 82 of secondary winding of the transformer 76 is connected to ground and the other side 84 of the secondary winding thereof is connected through conductor 86 to one terminal 43 of voltage comparitor 44. The conductor 86 is also connected through diode 88 to a 5 volt power source. A five volt bias is applied through resistors 90 and 92 to ground. A center tap between resistor 90 and 92 is connected through conductor 94 to the opposite terminal 55 of the voltage comparitor 44. The voltage comparitor is conventionally driven by a 24 volt source and has an output conductor 96 connected to detector 60 which conductor is biased by the 5 volt source through resistor 98. In this embodiment, the testing of each of the heaters 20*a* through 20*n* is done by detecting a change in the signal as a pulse through the toroidal core transformer 76. For example, if in testing, resistance element 20*a* is open, no current will flow and hence there will be no current flow through the primary side of the toroidal coil of the transformer 76 and hence no signal will be generated on the secondary side. However, if upon closing transistor 32*a* the resistance heater 20*a* is functioning, a current will flow through the resistance heater 20*a* to ground which will cause a voltage in the primary of the toroidal coil transformer 76 which in turn will induce a voltage in the secondary winding of transformer 76 which voltage will be delivered through conductor 86 to terminal 43 of the voltage comparitor 44. This will provide a change of status in the output which results indicate a heater is functioning whereas the lack of an output change indicates a heater that is non-functioning, just as in the previous embodiment.

Figure 4:
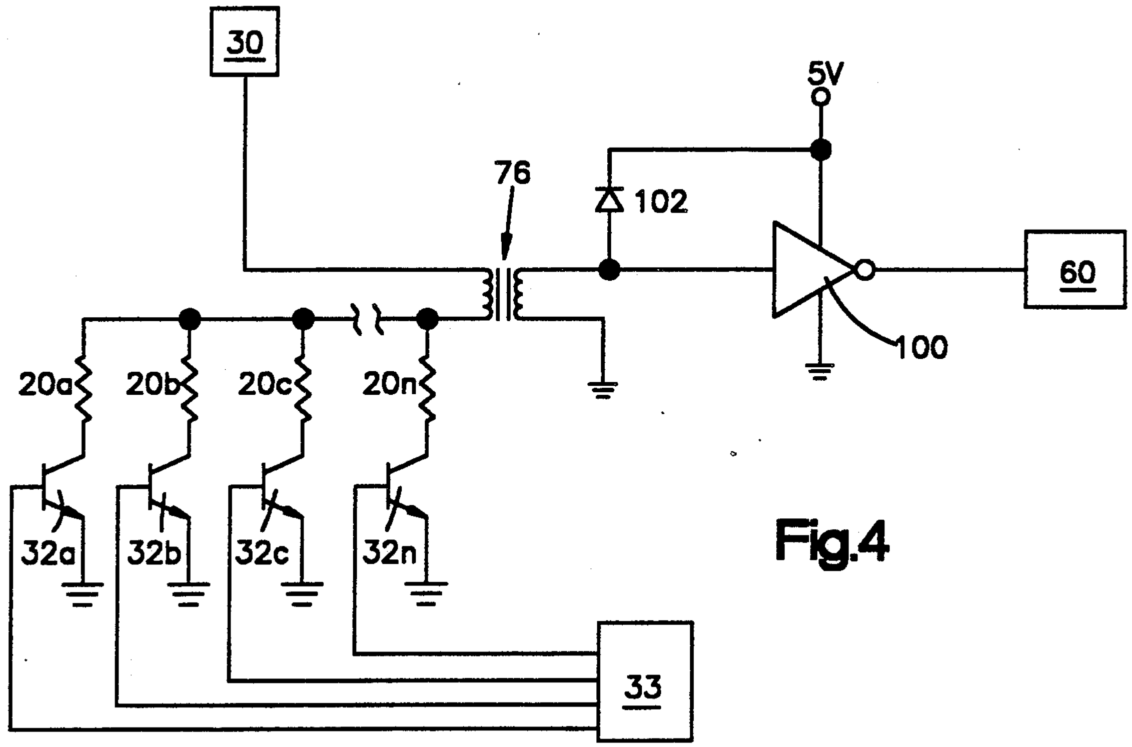
FIG. 4 is a circuit diagram of yet another embodiment of a circuit for determining whether a heating element is operating in a given nozzle.

Referring now to FIG. 4, another embodiment of the test circuit is depicted which is similar to that shown in FIG. 3. In this embodiment, the output of the toroidal core transformer 76 is supplied directly to a Schmidt trigger 100. One such suitable trigger part is a Hex Schmidt Trigger Invertor sold by Texas Instrument Corp. Part No. 7414. The Schmidt trigger is a single input device the output of which will change state when the input level exceeds a known threshold. This change of state is detected by the detector 60 as in the above embodiment. A clamping diode 102 is provided which clamps the input of Schmidt Trigger 100 to a 5 volt supply, providing over-voltage protection.

This invention is superior to prior art in the respect that it does not require a separate power supply to be used for the diagnostic routine (which if required would have to be switched in and out of the active circuit) This invention does not require that additional level of complexity. In the prior art this switching type of scheme is required due to an inordinately large and varying voltage drop that would occur across the sensing device when a large number of heater elements are fired simultaneously. This large voltage drop should be avoided due to its detrimental effect on the performance of the printhead. In the disclosed invention the non-linearity of the diode or the low impedance of the toroid prevent a large variation in the voltage as applied to the heater elements.

While several embodiments for the invention have been shown and described, various adaptations and modifications can be made without departing from the scope of the invention as defined in the appended claims.

We claim:

1. Apparatus for detecting failure of a thermal jet printing device wherein said printing device includes a plurality of electrically actuated printing jets, each of said printing jets including electrical resistance heating elements to generate a bubble, and wherein there is provided electrical means including power supply means to supply current to said resistance heating elements, and control means to selectively connect said resistance heating elements to the power supply means in preselected arrays;

the improvement which comprises;

signal generating and detecting means nonlinearly coupled to said resistance heating elements in continuous active circuit relationship therewith, said generating and detecting means including means to generate a signal responsive to a detected resistance heating element which varies from a given value when said resistance heating elements are connected to said power supply means, said control means being operably connectable to each of said resistance heating elements to selectively connect said resistance heating elements to the power supply for a selected test period of time;

whereby either the failure or operation of a resistance heating element can be detected by the detection of a signal indicating increased resistance.

2. The invention of claim 1 further characterized by said signal generating and detecting means including voltage comparator means in circuit relationship with said resistance elements and said voltage supply means arranged to provide the signal for said varied resistance.

3. The invention as defined in claim 2 wherein said voltage comparator means is connected to change state when the resistance sensed responsive to connection of the resistance heating element to the power supply is less than a preselected value and to remain in a given state responsive to a detected resistance value higher than said given value.

4. The invention as defined in claim 1 wherein said signal generating and detecting means includes transformer means connected in circuit relationship with said resistance elements to generate an output signal responsive to a resistance value which varies a given amount from a selected value.

5. The invention as defined in claim 4 wherein the output of said transformer means is applied to a voltage comparator connected in circuit relationship therewith.

6. The invention as defined in claim 4 wherein the output from said transformer means is supplied to a Schmidt Trigger, in circuit relationship therewith.

7. The invention as defined in claim 1 wherein said control means is operably connectable to each of said resistance heating elements to connect each resistance heating element individually to said power supply for said selected test period.

8. A method for detecting failure of a thermal jet printing device in which said printing device includes a plurality of electrically actuated printing jets, each of said printing jets including electrical resistance heating elements to generate a bubble, and wherein there is provided electrical means including power supply means to supply current to said resistance heating elements, and control means to selectively connect said resistance heating elements to the power supply means in preselected arrays;

said method comprising;

non-linearly coupling said resistance heating elements to a signal generating and detecting means in continuous active circuit relationship therewith, said generating and detecting means including means to generate a signal responsive to a detected resistance which varies from a given value when said resistance heating elements are connected to said power supply means, periodically connecting said resistance heating elements to the power supply for a selected test period of time;

and detecting said signal generated which varies from said given value when it occurs.

9. The method of claim 8 further characterized by said signal generating and detecting means including voltage comparator means in circuit relationship with said resistance heating elements and said voltage supply means arranged to provide the signal for said varied resistance.

10. The invention as defined in claim 9 wherein said voltage comparator means is connected to change state when the resistance sensed responsive to connection of the resistance heating element to the power supply is less than a preselected value and to remain in a given state responsive to a detected resistance value higher than said given value.

11. The invention as defined in claim 8 wherein said signal generating and detecting means includes transformer means connected in circuit relationship with said resistance heating elements to generate an output signal responsive to a resistance value which varies a given amount from a selected value.

12. The invention as defined in claim 11 wherein the output of said transformer means is applied to a voltage comparator connected in circuit relationship therewith.

13. The invention as defined in claim 11 wherein the output from said transformer means is supplied to a Schmidt Trigger, in circuit relationship therewith.

14. The invention as defined in claim 8 wherein said selected test period of time is less than the time required to generate a bubble of sufficient size to expel a drop of ink.

15. The method as defined in claim 8 wherein each of said resistance heating elements is connected individually to the power supply for said selected prior of time.

* * * * *